United States Patent
De Heer

(10) Patent No.: US 9,018,101 B2
(45) Date of Patent: Apr. 28, 2015

(54) PATTERNED GRAPHENE STRUCTURES ON SILICON CARBIDE

(75) Inventor: Walt A. De Heer, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/002,420

(22) PCT Filed: Mar. 16, 2012

(86) PCT No.: PCT/US2012/029374
§ 371 (c)(1),
(2), (4) Date: Nov. 15, 2013

(87) PCT Pub. No.: WO2012/125898
PCT Pub. Date: Sep. 20, 2012

(65) Prior Publication Data
US 2014/0061912 A1    Mar. 6, 2014

Related U.S. Application Data

(60) Provisional application No. 61/453,611, filed on Mar. 17, 2011.

(51) Int. Cl.
| | | |
|---|---|---|
| H01L 29/06 | (2006.01) | |
| H01L 21/768 | (2006.01) | |
| H01L 29/16 | (2006.01) | |
| H01L 23/522 | (2006.01) | |
| H01L 23/532 | (2006.01) | |

(52) U.S. Cl.
CPC ...... *H01L 21/76885* (2013.01); *H01L 29/1606* (2013.01); *H01L 21/76879* (2013.01); *H01L 23/5226* (2013.01); *H01L 23/53276* (2013.01); *Y10S 438/931* (2013.01)

(58) Field of Classification Search
CPC ............ H01L 29/1606; H01L 29/1608
USPC ......... 438/640, 478, 712, 931; 257/E29.104, 257/E21.128
See application file for complete search history.

(56) References Cited

U.S. PATENT DOCUMENTS

| | | | |
|---|---|---|---|
| 4,389,429 A | 6/1983 | Soclof | |
| 4,430,305 A * | 2/1984 | Kalejs et al. | 117/211 |
| 6,133,587 A | 10/2000 | Takeuchi et al. | |
| 7,015,142 B2 | 3/2006 | DeHeer et al. | |
| 7,327,000 B2 | 2/2008 | DeHeer et al. | |
| 7,732,859 B2 * | 6/2010 | Anderson et al. | 257/328 |
| 7,989,067 B2 | 8/2011 | DeHeer et al. | |
| 8,173,095 B2 | 5/2012 | DeHeer et al. | |

(Continued)

OTHER PUBLICATIONS

International Bureau PCT; "International Preliminary Report on Patentability"; 3013-09-17; Geneva, CH.

*Primary Examiner* — Jasmine Clark
(74) *Attorney, Agent, or Firm* — Bryan W. Bockhop; Bockhop & Associates, LLC

(57) ABSTRACT

In a method for making graphitic ribbons in a face of a carbide crystal (110), in which an elongated trench (120) is formed along a predetermined path in the face (112) of the carbide crystal (110), the trench (120) including a horizontal floor (124) coupling two vertical walls (122), the trench (120) following a path on which it is desired to form a graphitic ribbon (130). The carbide crystal (110) and the trench (120) are subjected to an annealing environment for an amount of time sufficient to cause a graphene ribbon (130) having a V-shaped cross section to form along the predetermined path of the trench (120).

11 Claims, 1 Drawing Sheet

(56) References Cited

U.S. PATENT DOCUMENTS

| | | |
|---|---|---|
| 8,221,884 B2 | 7/2012 | DeHeer et al. |
| 8,460,764 B2 | 6/2013 | DeHeer et al. |
| 2008/0220620 A1 | 9/2008 | Kawada et al. |
| 2009/0236608 A1 | 9/2009 | de Heer et al. |
| 2010/0019250 A1 | 1/2010 | Nakamura et al. |
| 2010/0062582 A1 | 3/2010 | Fujikawa |

* cited by examiner

PATTERNED GRAPHENE STRUCTURES ON SILICON CARBIDE

CROSS-REFERENCE TO RELATED APPLICATION(S)

This application claims the benefit of U.S. Provisional Patent Application Ser. No. 61/453,611, filed Mar. 17, 2011, the entirety of which is hereby incorporated herein by reference.

BACKGROUND OF THE INVENTION

1. Field of the Invention

The present invention relates to electronic devices and, more specifically, to electronic devices employing thin-film graphitic ribbons.

2. Description of the Related Art

Electronic devices based on interconnected graphitic structures have been proposed as an alternative to silicon based electronics. Methods have been developed to produce and to pattern graphitic material on silicon carbide in order to produce interconnected graphitic structures.

Ultra-thin graphitic layers grow on silicon carbide crystals when they are subjected to a high temperature annealing process, in which the silicon carbide crystal is heated in a vacuum or in other controlled environments to temperatures in the range of 1200° C. to about 1500° C. for about 30 seconds to about 2 hours. At these high temperatures, silicon evaporates from the silicon carbide surface so that the surface becomes carbon rich. This carbon rich surface then converts to an ultra-thin graphitic layer consisting of from one to several hundred graphene sheets. This ultra-thin graphitic layer is also known as multi-layered graphene. Ultra-thin graphitic layers grow more quickly on the carbon terminated face of hexagonal silicon carbide, while they grow more slowly on the silicon terminated face. Under similar growth conditions, the rate of growth on the carbon terminated face is about an order of magnitude greater then on the silicon terminated face.

Ultra-thin graphitic layers can be patterned using microelectronics lithography methods to produce patterned ultra-thin graphitic layers on silicon carbide. For example, an ultra-thin graphitic layer can be patterned by applying a thin coating of poly methyl methacrylate (PMMA), which inhibits growth of graphitic layers during annealing, on an ultra-thin graphitic layer that is subsequently exposed to electron irradiation supplied by an electron beam lithographer. This causes a chemical change in the PMMA so that when the PMMA is developed, the PMMA on areas that have not been exposed to the electron beam irradiation are removed and areas that have been exposed to the electron beam remain. In this way, a PMMA pattern is produced. The pattern includes selected areas on the ultra-thin graphitic layer that are covered with PMMA and other areas where the PMMA have been removed.

Subjecting the silicon carbide crystal and graphitic layer to an oxygen plasma treatment (e.g., by using the reactive ion etching method) results in ultra-thin graphitic layers that are not covered by the PMMA being consumed by the reactive ions, resulting in a patterned ultra-thin graphitic layer on a silicon carbide crystal. Such patterned ultra-thin graphitic layers have been shown to have beneficial electronic properties.

Use of thin graphitic nanoribbons can give rise to ballistic charge transport, which could give rise to extremely fast and highly efficient electronic circuits. Ultra-thin graphitic patterns are required for many functional electronic structures using existing methods. A graphitic ribbon with a width that is less than 20 nm is required to produce a band gap in the graphitic ribbon that is sufficiently large for certain room-temperature electronics applications. Hence, there are many applications that require ultra-thin graphitic ribbons in which the ribbon width is less than 20 nm. Such a width may be difficult to achieve using conventional microelectronics lithography methods. Also, conventional microelectronics patterning methods applied to ultra-thin graphitic layers on silicon carbide involve processes that etch the ultra-thin graphitic layer to produce desired shapes. This etching process may produce patterned ultra-thin graphitic layers with damaged edges, which may interfere with the functionality of the graphitic structures.

Therefore, there is a need for a method for growing ultra-thin graphitic ribbons only on selected areas of a silicon carbide crystal.

SUMMARY OF THE INVENTION

The disadvantages of the prior art are overcome by the present invention which, in one aspect, is a method for making graphitic ribbons in a face of a carbide crystal, in which an elongated trench is formed along a predetermined path in the face of the carbide crystal, the trench including a horizontal floor coupling two vertical walls, the trench following a path on which it is desired to form a graphitic ribbon. The carbide crystal and the trench are subjected to an annealing environment for an amount of time sufficient to cause a graphene ribbon having a V-shaped cross section to form along the predetermined path of the trench.

In another aspect, the invention is a graphitic structure that includes a carbide crystal having a selected face and an elongated graphene ribbon disposed on the selected face of the carbide crystal. The elongated graphene ribbon has a V-shape cross section.

In yet another aspect, the invention is a structure that includes a substrate and a graphene film. The substrate has a face defining an elongated indentation having a V-shaped cross section. The graphene film is disposed on the elongated indentation.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
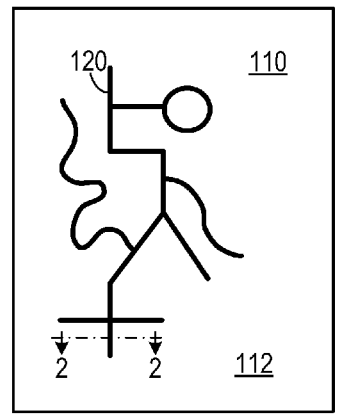
FIG. 1 is a top plan view of a carbide crystal with a trench defined thereby.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
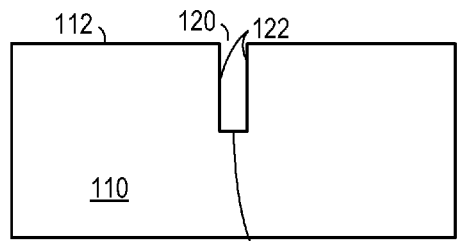
FIG. 2 is a cross sectional view of a portion of the carbide crystal shown in FIG. 1, taken along line 2-1.
Figure 3:
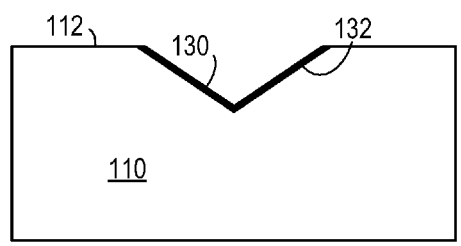
FIG. 3 is a cross sectional view of the portion shown in FIG. 2 after the carbide crystal has been subject to an annealing environment.
Figure 4:
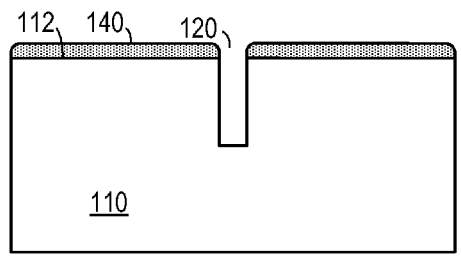
FIG. 4 is a cross sectional view of a trench formed with a mask.

As shown in FIGS. 1-3, in one embodiment, a trench 120 is formed on a selected face 112 of a carbide crystal 110 (such as a [000$\bar{1}$] face of a carbide crystal). The trench 120 may be etched into the carbide crystal 110, for example, by focusing an ion beam (such as a fluoride ion beam) onto the face 112 of the crystal 110 while moving the ion beam along the predetermined path. The ion beam would have an intensity sufficient to remove material from the face of the carbide crystal. Alternatively, as shown in FIG. 4, etching may be accomplished by applying a mask 140 to the face 112 of the carbide crystal 110 in which the mask exposes the predetermined path of the trench 120. The mask 140 could include, for example, a metal such as nickel and aluminum, or any other material known in the art of lithographic etching. The carbide crystal and the mask is placed in an environment that causes material to be removed from the carbide crystal 110 for an amount of time sufficient to form the elongated trench 120, such as an ionic gas. For example, using a well known reactive ion etching (RIE) system the environment could include $SF_6$ or $SiF_6$ gas and the exposure time could range from a few seconds up to a half an hour, depending on the desired trench depth.

Returning to FIGS. 1-3, the trench 120 has two vertical sidewalls 122 and a horizontal floor 124. In one embodiment, the height of the sidewalls 122 is at least three times the width of the floor 124. This height to width ratio may be sufficient so that the sidewalls 122 merge into a V-shape during the annealing process. Typically the width of the floor 124 and height of the sidewalls 122 would be at the nanoscale.

The carbide crystal and the trench are placed in an annealing environment, which causes elements that are more volatile than carbon (such as silicon, when the crystal 110 is a silicon carbide crystal) to boil off, leaving a graphene residue. Because of inherent un-evenness in the annealing graphitization process, the side walls 122 will eventually merge and form a graphene ribbon 130 in an indentation 132 where the trench 120 was formerly located.

In annealing, the carbide crystal 110 and the trench 120 are placed in a sealed vessel (not shown) and a vacuum (typically of at least $10^{-4}$ Torr) is applied to the vessel using a vacuum pump. When the crystal 110 is a silicon carbide crystal, it is heated to at least 1450° C. for at least 10 minutes, which is sufficient to form a graphene layer in the trench 120. Residual graphene may be removed from a top surface of the face 112 of the carbide crystal 110 if no mask was used to cover it during the annealing process. U.S. Pat. No. 7,015,142, issued to DeHeer et al., discloses methods for forming graphene layers through annealing silicon carbide and is, therefore, incorporated herein by reference.

Figure 5:
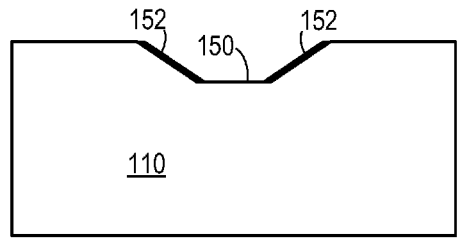
FIG. 5 is a cross sectional view of a wide trench in which the graphene ribbons are separated.

As shown in FIG. 5, in some embodiments it is desirable to have graphene ribbons 152 that are separated from each other by a crystalline floor 150. This can be accomplished by using a trench in which the sidewalls are less than three times higher than the floor is wide. For example, a sidewall height to floor width ratio of 1:1 could result in separate ribbons 152.

The graphene ribbons made according to the embodiments above have clean edges and demonstrate ballistic charge transport. This makes them suitable for integrated circuit applications.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method for making graphitic ribbons in a face of a carbide crystal, comprising the steps of:
    (a) forming an elongated trench along a predetermined path in the face of the carbide crystal, the trench including a horizontal floor coupling two vertical sidewalls, the trench following a path on which it is desired to form a graphitic ribbon; and
    (b) subjecting the carbide crystal and the trench to an annealing environment for an amount of time sufficient to cause a graphene ribbon having a V-shaped cross section to form along the predetermined path of the trench.

2. The method of claim 1, further comprising the step of removing residual graphene from a top surface of the face of the carbide crystal.

3. The method of claim 1, wherein the step of forming the elongated trench comprises the step of etching.

4. The method of claim 3, wherein the etching step comprises the steps of focusing an ion beam onto the face of the crystal and moving the ion beam along the predetermined path, the ion beam having an intensity sufficient to remove material from the face of the carbide crystal.

5. The method of claim 3, wherein the etching step comprises the steps of:
    (a) applying a mask to the face of the carbide crystal, the mask exposing the predetermined path; and
    (b) placing the carbide crystal and the mask in an environment that causes material to be removed from the carbide crystal for an amount of time sufficient to form the elongated trench.

6. The method of claim 5, wherein the mask comprises a material selected from a group of materials consisting of: nickel and aluminum.

7. The method of claim 1, wherein the two vertical sidewalls have a sidewall height and wherein the horizontal floor has a floor width, and wherein the floor width is narrow enough so that graphene layers forming on the sidewalls merge when the carbide crystal is subjected to the annealing environment.

8. The method of claim 7, sidewall height is at least three times the floor width.

9. The method of claim 1, wherein the carbide crystal comprises a silicon carbide crystal.

10. The method of claim 9, wherein the step of subjecting the carbide crystal and the trench to an annealing environment comprises the steps of:
    (a) placing the carbide crystal in a substantially sealed vessel;
    (b) applying a vacuum to the sealed vessel; and
    (c) heating the sealed vessel to a temperature at which silicon boils off from the silicon carbide crystal, thereby leaving a graphene residue on the silicon carbide crystal.

11. The method of claim 10, wherein the vacuum comprises a vacuum of at least $10^{-4}$ Torr and wherein the temperature is at least 1450° C.

\* \* \* \* \*